(12) United States Patent
Huang

(10) Patent No.: US 10,598,314 B2
(45) Date of Patent: Mar. 24, 2020

(54) LED LAMP

(71) Applicant: Liquidleds Lighting Corp., Taipei (TW)

(72) Inventor: Chien-Lang Huang, Taipei (TW)

(73) Assignee: Liquidleds Lighting Corp., Taipei (TW)

(*) Notice: Subject to any disclaimer, the term of this patent is extended or adjusted under 35 U.S.C. 154(b) by 0 days.

(21) Appl. No.: 15/848,003

(22) Filed: Dec. 20, 2017

(65) Prior Publication Data

US 2018/0283619 A1  Oct. 4, 2018

Related U.S. Application Data

(60) Provisional application No. 62/479,327, filed on Mar. 31, 2017.

(30) Foreign Application Priority Data

Oct. 23, 2017  (TW) .............................. 106136278 A

(51) Int. Cl.
*F21V 19/00* (2006.01)
*F21K 9/232* (2016.01)
(Continued)

(52) U.S. Cl.
CPC .............. *F21K 9/232* (2016.08); *F21K 9/235* (2016.08); *F21S 4/28* (2016.01); *F21S 10/002* (2013.01);
(Continued)

(58) Field of Classification Search
CPC ..... F21K 9/232; F21K 9/235; H01L 25/0753; H01L 33/54; H01L 33/483; H01L 33/52;
(Continued)

(56) References Cited

U.S. PATENT DOCUMENTS 2,885,538 A  5/1959  Mahon et al.
4,122,142 A * 10/1978 Lawrence ............... B29C 49/00
215/12.2
(Continued)

FOREIGN PATENT DOCUMENTS

CN  2413390 Y  1/2001
CN  2718387 Y  8/2005
(Continued)

*Primary Examiner* — William J Carter
*Assistant Examiner* — Omar Rojas Cadima
(74) *Attorney, Agent, or Firm* — Alan D. Kamrath; Karin L. Williams; Mayer & Williams PC

(57) ABSTRACT

An LED lamp has an LED device and a lamp base. The LED device has multiple LED chips, multiple conductive substrates, a packaging layer and a protective cover. The multiple conductive substrates are arranged at intervals. Each of the LED chips is supported by and electrically connected between two adjacent conductive substrates. The packaging layer covers the LED chips and covers a part of each conductive substrate. The protective cover covers the LED chips and the conductive substrates to form an LED device in a specific shape. As the LED chips are close to the protective cover, thermal energy generated by the LED chips is rapidly dissipated into the air to improve the heat dissipation. The LED device achieves a continuous uniform lighting effect by a proper arrangement of the LED chips.

13 Claims, 18 Drawing Sheets

(51) Int. Cl.

| | | |
|---|---|---|
| *F21V 3/02* | (2006.01) | |
| *F21V 29/56* | (2015.01) | |
| *F21V 29/71* | (2015.01) | |
| *F21S 4/28* | (2016.01) | |
| *F21K 9/235* | (2016.01) | |
| *F21S 10/00* | (2006.01) | |
| *F21V 31/00* | (2006.01) | |
| *H01L 25/075* | (2006.01) | |
| *H01L 33/52* | (2010.01) | |
| *H01L 33/62* | (2010.01) | |
| *F21V 29/506* | (2015.01) | |
| *H01L 33/48* | (2010.01) | |
| *H01L 33/54* | (2010.01) | |
| *F21Y 115/10* | (2016.01) | |
| *F21Y 103/10* | (2016.01) | |
| *F21V 9/00* | (2018.01) | |

(52) U.S. Cl.
CPC .............. *F21V 3/02* (2013.01); *F21V 19/001* (2013.01); *F21V 29/506* (2015.01); *F21V 29/56* (2015.01); *F21V 29/71* (2015.01); *F21V 31/005* (2013.01); *H01L 25/0753* (2013.01); *H01L 33/483* (2013.01); *H01L 33/52* (2013.01); *H01L 33/54* (2013.01); *H01L 33/62* (2013.01); *F21V 9/00* (2013.01); *F21Y 2103/10* (2016.08); *F21Y 2115/10* (2016.08)

(58) Field of Classification Search
CPC ........... H01L 33/62; F21S 10/002; F21S 4/28; F21V 19/001; F21V 29/506; F21V 29/56; F21V 29/71; F21V 31/005; F21V 3/02; F21V 9/00; F21Y 2115/10; F21Y 2103/10
See application file for complete search history.

(56) References Cited

U.S. PATENT DOCUMENTS

| | | | |
|---|---|---|---|
| 6,371,637 | B1 | 4/2002 | Atchinson et al. |
| 6,379,021 | B1 | 4/2002 | Shieh |
| 7,055,981 | B2 | 6/2006 | Yao |
| 7,192,157 | B2 | 3/2007 | Sloan et al. |
| 7,234,838 | B2 | 6/2007 | Sloan et al. |
| 8,115,370 | B2 | 2/2012 | Huang |
| 8,155,370 | B2 | 2/2012 | Huang |
| 8,511,849 | B2 | 8/2013 | Sloan et al. |
| 9,231,171 | B2 | 1/2016 | Liu |
| 9,825,012 | B2 | 11/2017 | Hsieh |
| 2002/0047516 | A1 | 4/2002 | Iwasa et al. |
| 2004/0007981 | A1 | 1/2004 | Shibata |
| 2005/0069442 | A1 | 3/2005 | Cho et al. |
| 2005/0281030 | A1 | 12/2005 | Leong et al. |
| 2007/0139949 | A1* | 6/2007 | Tanda ........................ F21V 9/30 362/551 |
| 2008/0055894 | A1 | 3/2008 | Deng |
| 2009/0140271 | A1 | 6/2009 | Bah |
| 2010/0164409 | A1 | 7/2010 | La et al. |
| 2012/0194071 | A1* | 8/2012 | Huang ........................ F21K 9/23 315/35 |
| 2015/0069442 | A1* | 3/2015 | Liu ........................ H01L 33/504 257/98 |
| 2015/0092413 | A1 | 4/2015 | Li et al. |
| 2015/0107330 | A1 | 4/2015 | Yokoyama et al. |
| 2016/0377237 | A1 | 12/2016 | Zhang |
| 2017/0248277 | A1 | 8/2017 | Huang |
| 2018/0112831 | A1 | 4/2018 | Huang |

FOREIGN PATENT DOCUMENTS

| | | | | |
|---|---|---|---|---|
| CN | 203517451 U | 4/2014 | | |
| CN | 104157772 A | 11/2014 | | |
| CN | 105570701 A | 5/2016 | | |
| DE | 102013100459 A1 * | 7/2013 | ................ | F21V 7/10 |
| EP | 1357331 A2 | 10/2003 | | |
| JP | 2015038853 A | 2/2015 | | |
| JP | 2015179648 A | 10/2015 | | |
| TW | M523810 U | 6/2016 | | |
| TW | 201705557 A | 2/2017 | | |
| TW | 201715761 A | 5/2017 | | |

* cited by examiner

0# LED LAMP

BACKGROUND OF THE INVENTION

1. Field of the Invention

The present invention relates to lighting fixtures and, more particularly, to an LED lamp.

2. Description of the Prior Arts

Referring to FIG. 16, a conventional LED bulb lamp 80 comprises an LED light bar 81, a supporting base 82, a lamp base 85, and a lamp housing 86. The LED light bar 81 is mounted on the supporting base 82 and is fixed to the supporting base 82 by a plurality of fixed blocks 83. The supporting base 82 is held in the lamp base 85. The lamp housing 86 is connected to the supporting base 82, so that the LED light bar 81 and the supporting base 82 are covered in the lamp housing 86.

In general, the lamp housing 86 is made of glass so the lamp housing 86 easily cracks or is even broken under collision or pressure. Further, there is a distance between the LED light bar 81 and the lamp housing 86, so the heat generated by the LED light bar 81 easily accumulates in the lamp housing 86 and is difficult to dissipate.

FIG. 17 shows a conventional LED light bar 90 which comprises a substrate 91, multiple LED chips 92 and multiple resistors 93. These resistors 93 are current limiting resistors, used to reduce the current flowing through the LED chips 92, and used to avoid the large load current causing high temperature, even burning of the LED chips 92. These LED chips 92 and resistors 93 are mounted on one surface of the substrate 91 and are staggered with each other, and the LED chips 92 and the resistors 93 are electrically connected.

Since each of the LED chips 92 belongs to the point light source and the resistors 93 are interposed between the LED chips 92, the distance between the respective LED chips 92 is too long. The illumination ranges of the two adjacent LED chips 92 are adjacent but not intersecting, and the LED light bar 90 presents an illumination effect of multiple point light sources, causing a problem of light discontinuity.

To overcome the shortcomings, the present invention provides an LED lamp to mitigate or obviate the aforementioned problems.

SUMMARY OF THE INVENTION

To overcome the problems of poor heat dissipation and discontinuous illumination of the conventional LED bulbs, the present invention provides an LED lamp that uses a protective cover as the lamp housing so that the heat generated by the light bar can be effectively dissipated, thereby improving heat dissipation. By using a packaging layer and arranging the LED chips in a specific way, the LED lamp is beneficial to heat dissipation and energy saving, while achieving a continuous and uniform light illumination effect.

To achieve the foregoing objective, the LED lamp comprises:
an LED device having:
multiple LED chips;
multiple conductive substrates, with each of the multiple conductive substrates being a metal foil, with the multiple conductive substrates arranged at intervals, with each of the LED chips supported by and electrically connected between two adjacent conductive substrates, with a length of each LED chip being W1, and with a distance between two adjacent LED chips being W2, and W2<2W1;
a packaging layer including an upper packaging layer, with the upper packaging layer pervious to light and covering the LED chips and top surfaces of the conductive substrates, with the packaging layer, the LED chips and the conductive substrates forming a light bar; and a protective cover being a curved tube mounted around the light bar, with the protective cover pervious to light and insulative;
a fixing block having at least one hole for allowing at least one end of
the light bar to pass through to mount the LED device to the fixing block;
a circuit board electrically connected to at least one end of the light bar for controlling the LED device; and
a lamp base for holding and mounting the fixing block and the circuit board therein.

An LED lamp comprises:
an LED device having:
multiple LED chips;
multiple conductive substrates having a plurality of positive electrode conductive substrates and a negative electrode conductive substrate, with the positive electrode conductive substrates arranged at intervals, with each of the LED chips supported by and electrically connected between two adjacent positive conductive substrates and the negative electrode conductive substrate, with a length of each LED chip being W1, with a distance between two adjacent LED chips being W2, and W2<2W1, and with the negative electrode conductive substrate provided on one side of the positive electrode conductive substrates;
a packaging layer including an upper packaging layer, with the upper packaging layer pervious to light and covering the LED chips and top surfaces of the conductive substrates, with at least one side of each positive electrode conductive substrate and the negative electrode conductive substrate extending beyond the packaging layer, and with the packaging layer, the LED chips and the conductive substrates forming a light bar; and
a protective cover being a curved tube mounted around the light bar, with the protective cover pervious to light and insulative;
a fixing block having at least one hole for allowing at least one end of the light bar to pass through to mount the LED device to the fixing block;
a circuit board electrically connected to at least one end of the light bar for controlling the LED device; and
a lamp base for holding and mounting the fixing block and the circuit board therein.

Since the LED chips belong to the point light source, the distance between two adjacent LED chips is controlled to be less than twice the length of each LED chip to ensure that the light bar shows continuous light. As the light bar, which is formed by connecting a plurality of the LED chips to a plurality of the conductive substrates in sequence, has flexibility, the LED device can be manufactured in any specific shape, thereby providing a variety of options. The upper packaging layer is in the shape of a semi-elliptical arc, so the light is emitted from the upper package uniformly, thereby achieving a continuous uniform lighting effect. Furthermore, as the protective cover covers the light bar, the distance between the light bar and the protective cover is so close that the heat generated by the light bar can be dissipated into the air quickly and is not accumulated in the protective cover easily, thereby improving a heat-dissipating effect.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
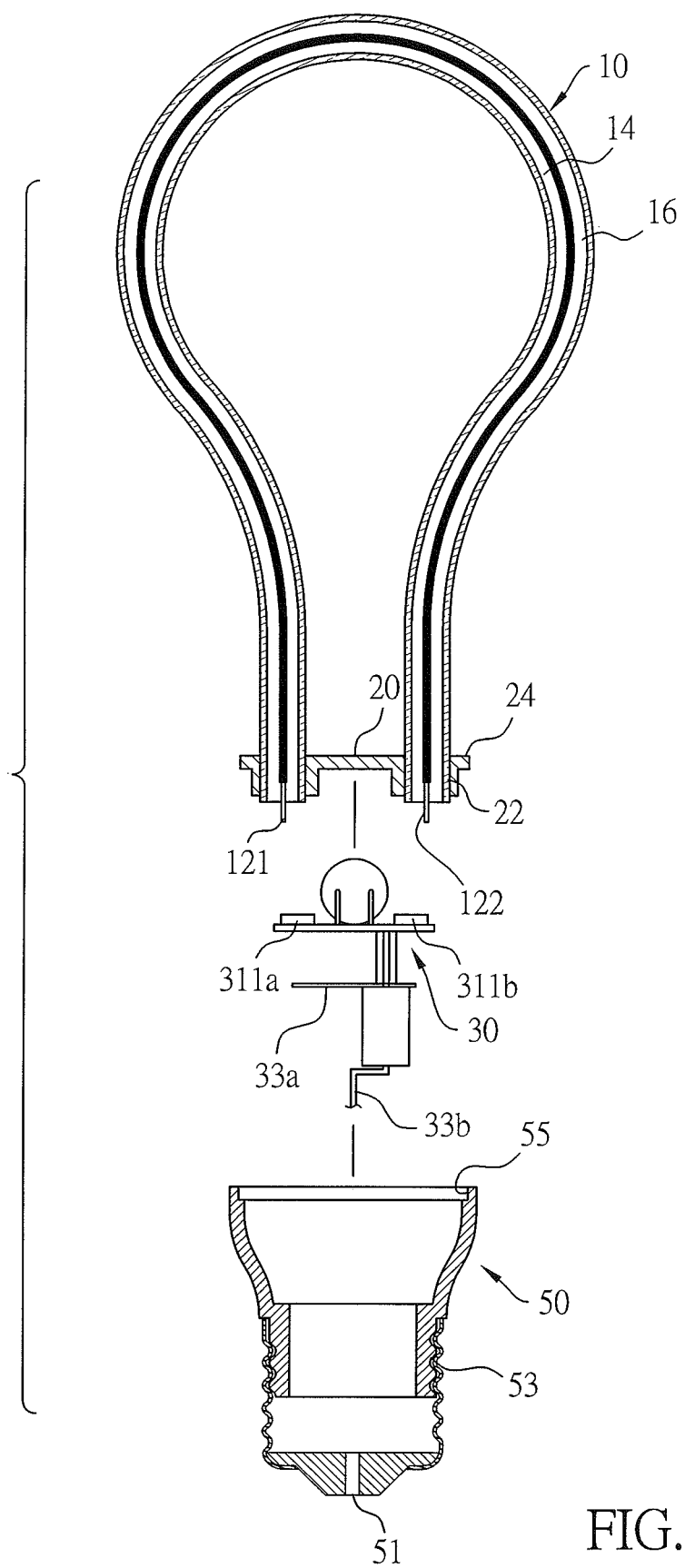
FIG. 1 is an exploded view of the LED lamp in accordance with the present invention.
Figure 6:
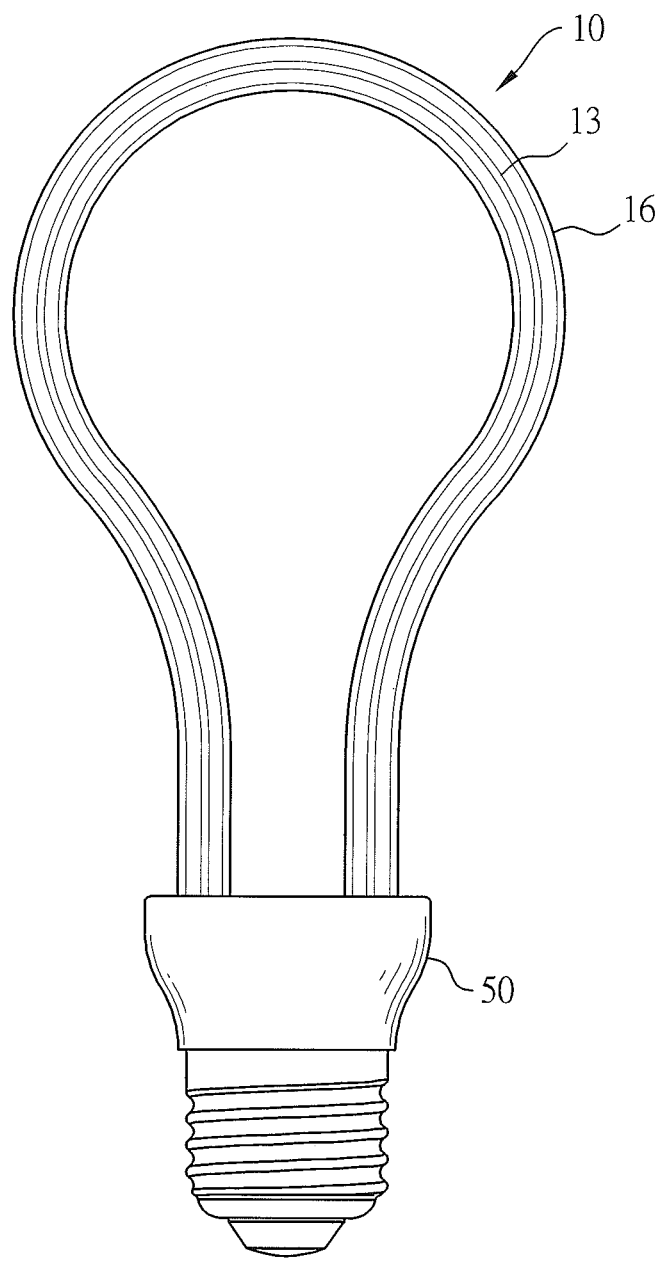
FIG. 6 is a schematic view of the present invention.

Referring to FIGS. 1 and 6, the present invention relates to an LED lamp, comprising an LED device 10, a fixing block 20, a circuit board 30, and a lamp base 50.

Figure 2:
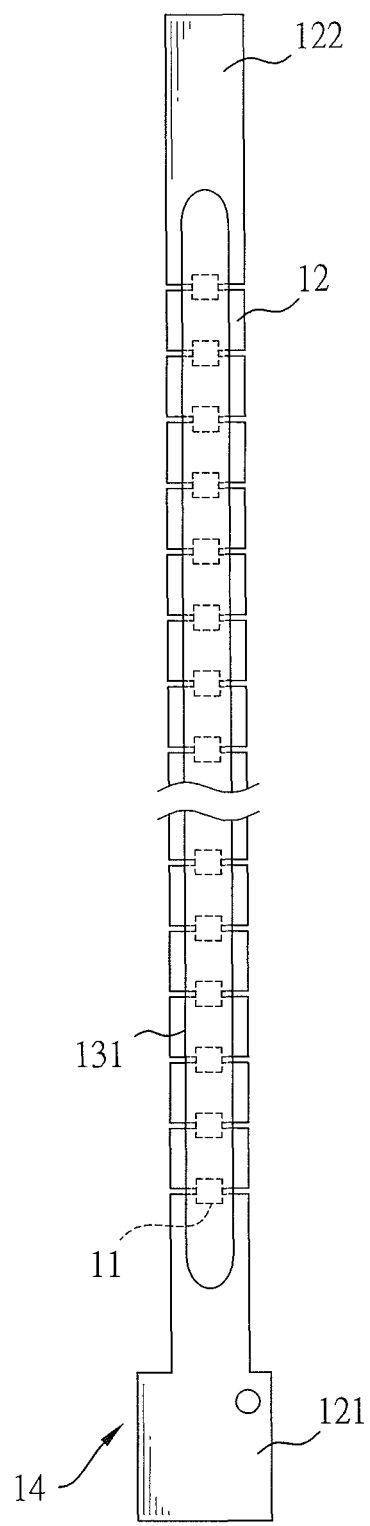
FIG. 2 is a schematic view of the light bar in accordance with the present invention.
Figure 3:
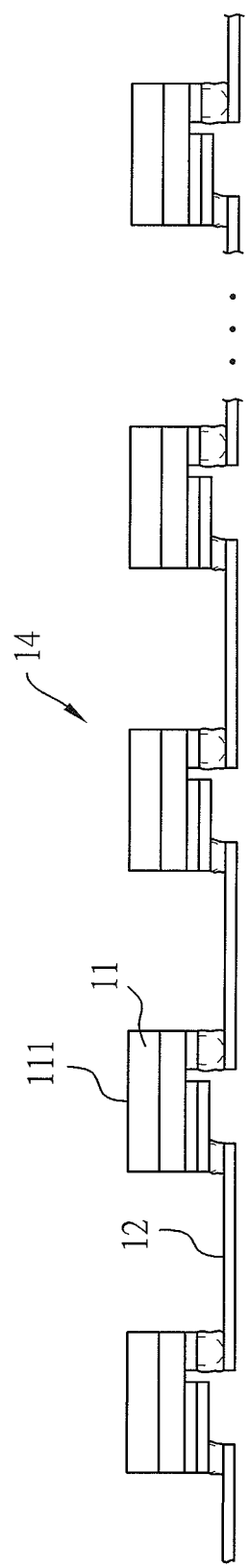
FIG. 3 is a side view of the light bar in accordance with the present invention.

Further referring to FIG. 2 and FIG. 3, the LED device 10 comprises a light bar 14, and the light bar 14 has multiple light emitting diode (LED) chips 11, multiple conductive substrates 12 and a packaging layer 13. In an embodiment, the packaging layer 13 has an upper packaging layer 131. The LED chips 11 may be LEDs with top and bottom surfaces, or may have at least one top light-emitting surface 111. The LED chips 11 can project the emitted light through the top light-emitting surface 111 outwardly, and the top light-emitting surface 111 is at the top of each LED chip 11. Each of the conductive substrates 12 is a metal conductive sheet. The conductive substrates 12 are arranged in a sequence with an interval between each two adjacent conductive substrates 12. Each of the LED chips 11 is mounted between two adjacent conductive substrates 12 and electrically connected to the two adjacent conductive substrates 12, thereby forming the light bar 14. In particular, one conductive substrate 12, one LED chip 11, one conductive substrate 12, one LED chip 11, etc. are alternately arranged in series. In the present embodiment, the light bar 14 has flexibility. In the embodiment, a first conductive portion 12 1 is formed on and extends from the conductive substrate 12 at one end of the light bar 14, and a second conductive portion 122 is formed on and extends from the conductive substrate 12 at the other end of the light bar 14. The first conductive portion 12 1 and the second conductive portion 122 are two opposite electrodes.

Figure 4:
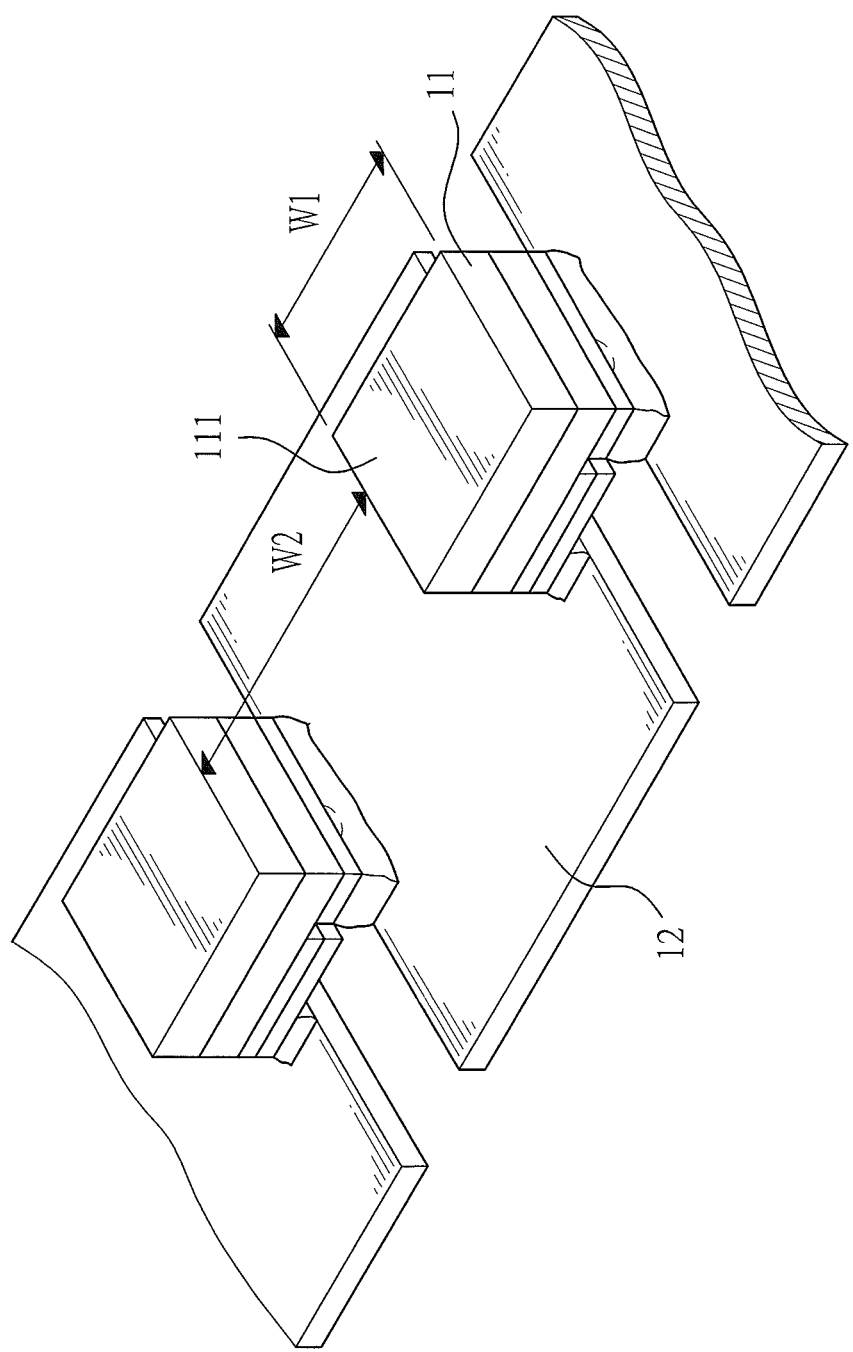
FIG. 4 is a perspective schematic view of the light bar in accordance with the present invention.

Referring to FIG. 4, in the present embodiment, each of the LED chips 11 is supported by two adjacent conductive substrates 12 and forms an electrical connection. Each LED chip 11 has a length W1, the distance between two adjacent LED chips 11 is W2, and the distance W2 is less than twice the length W1 (W2<2W1). So the number of the plurality of LED chips 11 can be sufficiently increased, and the effect of continuous light emission can be achieved.

Figure 5A:
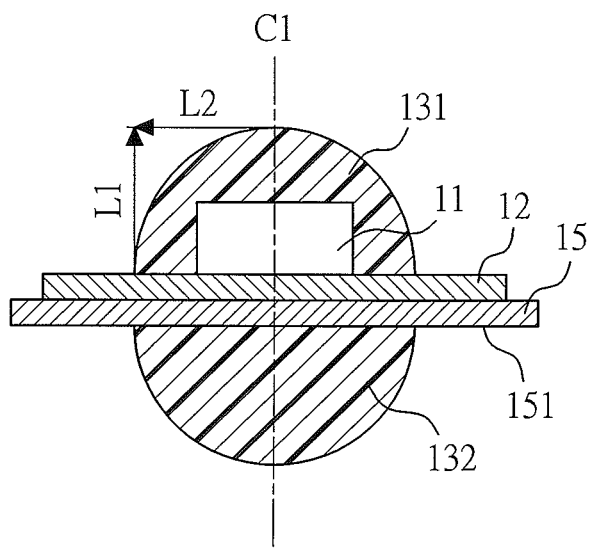
FIG. 5A is a sectional view of the light bar in accordance with the present invention.

FIG. 5A shows another embodiment of the light bar 14 which has a lower packaging layer 132 and a lower light-transmitting plate 15. The lower light-transmitting plate 15 is mounted on a bottom surface of each conductive substrate 12. The lower light-transmitting plate 15 has a bottom light-emitting surface 151 through which light can be emitted outwardly. The area of the lower light-transmitting plate 15 is equal to or larger than the area of each conductive substrate 12. The upper packaging layer 131 is semi-elliptical and is disposed on a top surface of the conductive substrate 12 and completely covers the plurality of LED chips 11. The lower packaging layer 132 is semi-elliptical and is disposed on a bottom surface of the lower light-transmitting plate 15. Both edges of each conductive substrate 12 are exposed to the upper and lower packaging layers 131, 132 and are not covered by the upper and lower packaging layers 131, 132. The protection to the LED chips 11 and the conductive substrates 12 can be improved by the combination of the upper packaging layer 131 and the lower packaging layer 132. The bonding strength between each LED chip 11 and each conductive substrate 12 is also enhanced so that the light bar 14 is not easily broken. In addition, a central axis C 1 is defined and extends from the center point of the conductive substrate 12 perpendicularly through the top light-emitting surface 111 and the bottom light-emitting surface 151. As the upper packaging layer 131 has a semi-elliptical shape viewed from the side, the thickness of the upper packaging layer 131, measured along a direction from the top surface of each conductive substrate 12 towards the light-emitting surface of each LED chip 11, is defined as a first length L 1. The thickness, laterally measured from the center axis C1 of each conductive substrate 12 to a side surface of the upper packaging layer 131, is defined as a second length L2. Three times the first length L1 is larger than the second length L2 (i.e., 3*L1>L2). The lower packaging layer 132 also has the similar configuration. When the plurality of LED chips 11 are emitting light, the light can be emitted outwardly along the radial direction of the upper and lower packaging layers 131 and 132, and then the light reflected by the upper and lower packaging layers 131, 132 is reduced and the light transmission is increased and uniform, thereby achieving a uniform lighting effect.

In the present embodiment, after the plurality of LED chips 11 and the plurality of conductive substrates 12 are electrically connected and fixed, a high-density coating material is applied to cover the surfaces of the LED chips 11 and portions of the conductive substrates 12 to cover each LED chip 11 completely, and then the flow condition and the hardening time of the coating material are controlled to form the upper packaging layer 131 and the lower packaging layer 132. The coating material for the upper packaging layer 131 and the lower packaging layer 132 may be a transparent resin material, a transparent silicone material, or a light-transmitting polymer material.

Figure 5B:
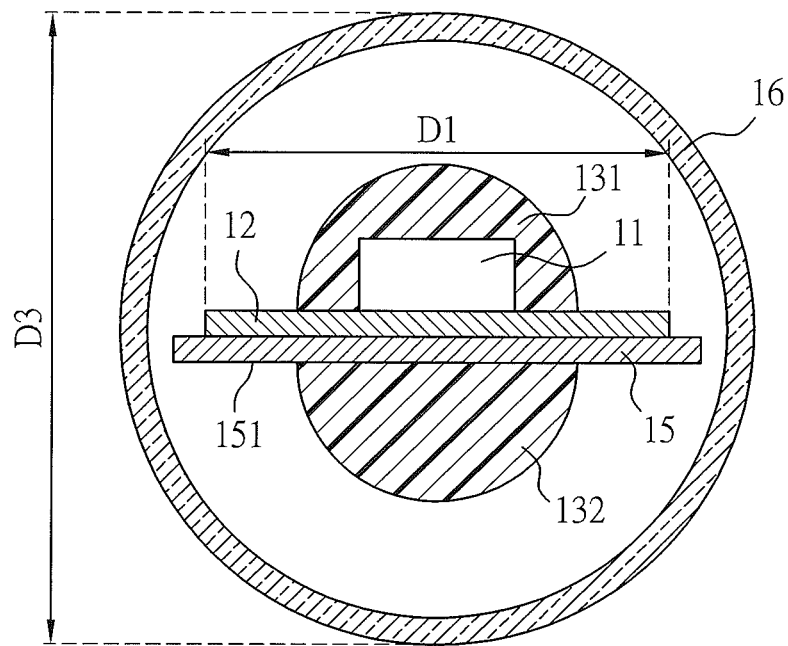
FIG. 5B is a sectional view of the LED device in accordance with the present invention.

As shown in FIG. 5B, the protective cover 16 may be formed as an elongated transparent structure. In this embodiment, the inner diameter of the protective cover 16 is between 3 mm and 15 mm, and the outer diameter of the protective cover 16 is between 4 mm to 16 mm. The protective cover 16 is a light-transmitting hollow tube for covering the light bar 14. The protective cover 16 can match the shape of the light bar 14, so that the light bar 14 is not easily broken. In the present embodiment, the protective cover 16 is an insulator that avoids the risk of electric shock when the user is in contact with the light bar 14. In addition, each conductive substrate 12 has two opposite edges respectively adjacent to the preceding conductive substrate 12 and the subsequent conductive substrate 12, and a distance measured between the two opposite edges is defined as a width D1 of the conductive substrate 12. The inner diameter of the protective cover 16 is D3, with $0.3<(D1/D3)<1$. When the ratio of the width D1 of the conductive substrate 12 to the inner diameter D3 of the protective cover 16 is between 0.3 and 1, the maximum light output can be achieved. In addition, the protective cover 16 can be made into a tube by extrusion molding, and then shaped by heating through the thermoplastic or other heating methods and molded. When the light bar 14 is placed in the protective cover 16, the friction between the protective cover 16 and the upper and lower packaging layers 131, 132 can be reduced because the two edges of each of the conductive substrates 12 are exposed from the upper and lower packaging layers 131 and 132. By the contact between the two edges of each of the conductive substrates 12 and the inner wall of the protective cover 16, the resistance is reduced when the light bar 14 is being placed into the protective cover 16. Furthermore, as the two edges of each of the conductive substrates 12 are in contact with the inner wall of the protective cover 16, the two edges of each of the conductive substrates 12 can be used as the supporting structure for the protective cover 16, which allows the protective cover 16 to be formed in a substantially circular shape or an oval shape viewed in cross section and reduces the pressure exerted by the protective cover 16 on each LED chip 11. Furthermore, in the present embodiment, the protective cover 16 is made of a transparent or translucent material, which can also ensure a good light transmission effect while protecting the light bar 14.

In this embodiment, two edges of each of the conductive substrates 12 are exposed outside the packaging layer 13 to be in contact with the inner wall of the protective cover 16. Moreover, as the friction between the conductive substrate 12 and the protective cover 16 is smaller than the friction between the packaging layer 13 and the protective cover 16, when the light bar 14 is mounted in the protective cover 16, the installation process can be smooth with small friction between each conductive substrate 12 and the protective cover 16, thereby reducing the time and difficulty of operation.

Referring to FIG. 1, in the present embodiment, the fixing block 20 is a circular block made of an insulating material, and a plurality of holes 22 are formed through the fixing block 20. In the present embodiment, the fixing block 20 has two holes 22, and in a preferred embodiment, each hole 22 is a circular hole. The diameter of each hole 22 corresponds to the LED device 10. The first conductive portion 121 and the second conductive portion 122 at both ends of the LED device 10 can be respectively inserted into the two holes 22 and fixed in the two holes 22, for example, fixed by adhesive bonding. Thus, the LED device 10 is firmly mounted on the fixing block 20. A flange 24 is formed around an outer edge of the fixing block 20.

The circuit board 30 is provided with a plurality of electrode terminals. In this embodiment, two electrode terminals 311a, 311b are formed on the circuit board 30. The electrode terminals 311a, 311b are opposite electrodes to each other, for example, a positive electrode terminal and a negative electrode terminal. The positive electrode terminal is electrically connected to the first conductive portion 121, and the negative electrode terminal is electrically connected to the second conductive portion 122. A control circuit is formed on the circuit board 30 by electronic components, such as capacitors, resistors and so on.

In one embodiment, the lamp base 50 may be a so called Edison's lamp base. The bottom of the lamp base 50 has a first electrical connection portion 51. A side of the lamp base 50 has a second electrical connection portion 53. The first electrical connection portion 51 and the second electrical connection portion 53 are for connecting to opposite polarities of an external power source. In the present embodiment, the second electrical connection portion 53 has a threaded surface. A stepped portion 55 is formed in an inner wall of the top of the lamp base 50 for supporting the flange 24 of the fixing block 20. In addition, the first electrical connection portion 51 and the second electrical connection portion 53 are respectively and electrically connected to electrode connection terminals 33a, 33b in the lamp base 50.

Figure 7:
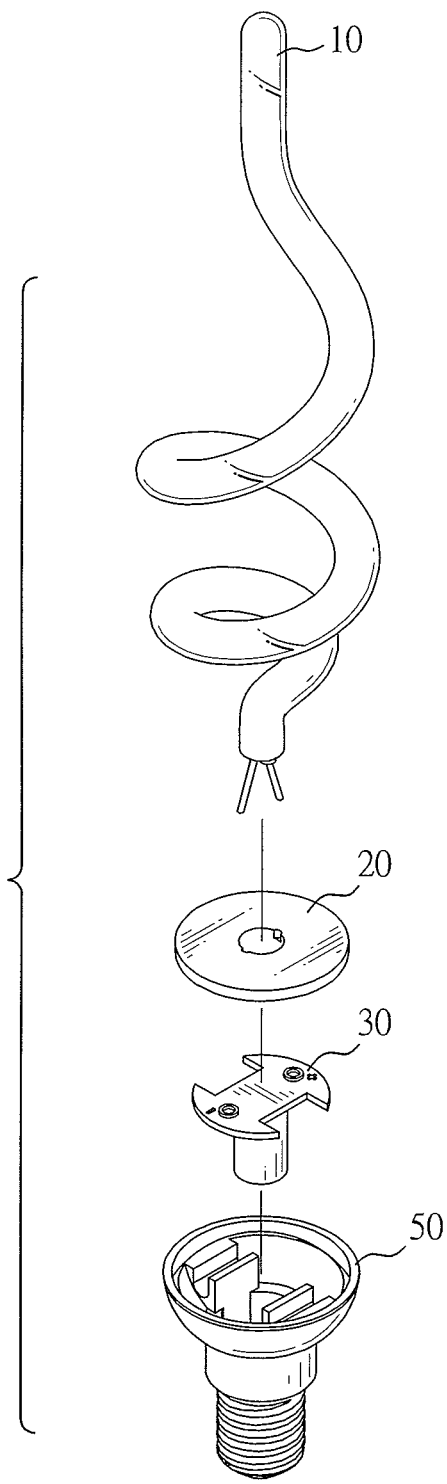
FIG. 7 is an exploded view of the LED lamp of another embodiment in accordance with the present invention.
Figure 8:
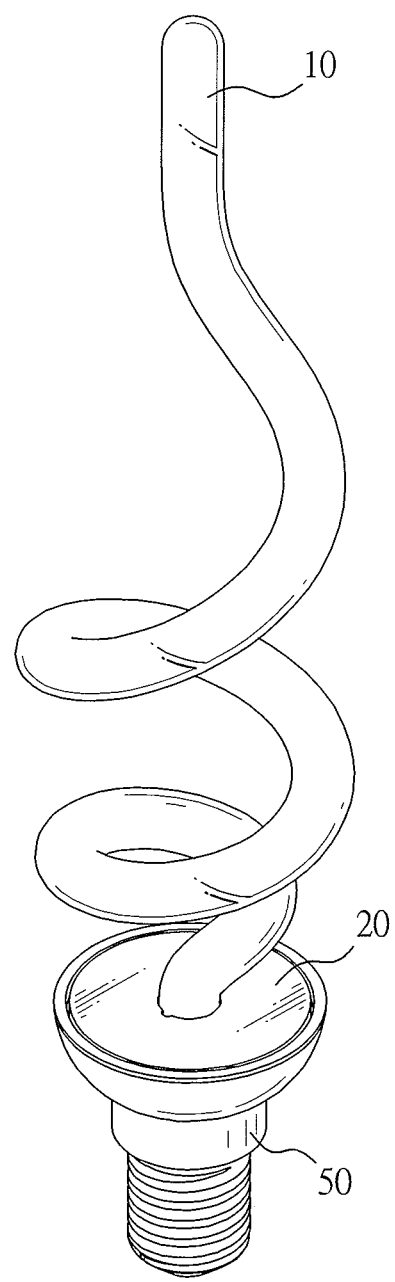
FIG. 8 is a schematic view of the LED lamp of another embodiment in accordance with the present invention.

Referring to FIG. 7 to FIG. 8, another preferred embodiment of the LED lamp differs from the previous embodiment in that only one end of the LED device 10 is inserted into the fixing block 20.

Figure 9:
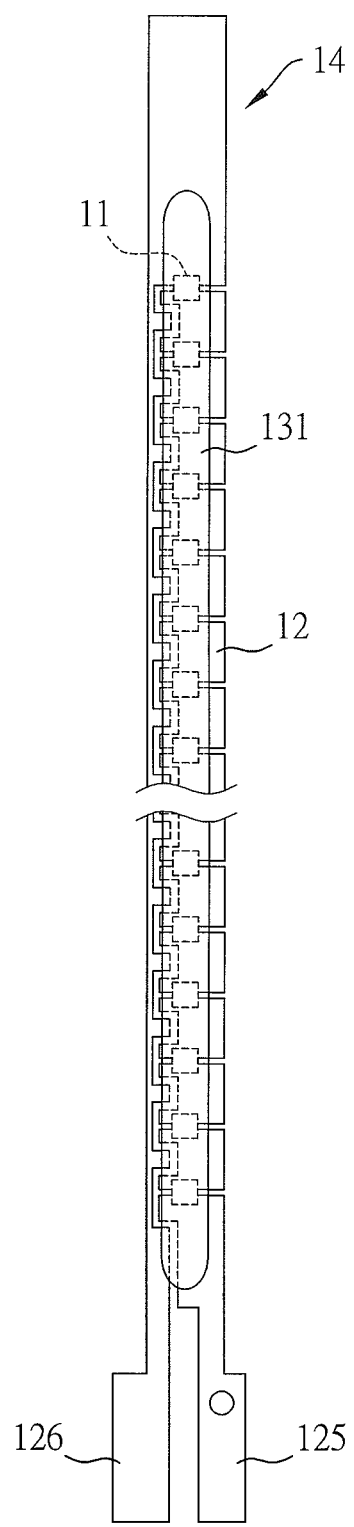
FIG. 9 is a schematic view of the light bar applied to the embodiment of FIG. 7 and FIG. 8 in accordance with the present invention.

In order to implement the LED lamp in FIG. 7 and FIG. 8, the light bar 14 in FIG. 9 is used in the present embodiment. The light bar 14 has multiple LED chips 11, multiple conductive substrates 12 and a packaging layer 13. The packaging layer 13 has an upper packaging layer 131. In this embodiment, each conductive substrate 12 includes a first conductive portion 125 and a second conductive portion 126. The first conductive portion 125 is at one distal end of the light bar 14 and is electrically connected to the conductive substrate 12 that is at the distal end. Each of the LED chips 11 is mounted and connected electrically between two adjacent conductive substrates 12, thereby forming a light bar 14. In particular, a conductive substrate 12, an LED chip 11, a conductive substrate 12, an LED chip 11, etc, are alternately arranged in series. The second conductive portion 126 is an elongated conductive plate, which is disposed beside the conductive substrates 12 but not connected to the conductive substrates 12. One end of the second conductive portion 126 is electrically connected to the LED chips 11 at the other distal end of the light bar 14, and a portion of the second conductive portion 126 is covered by the upper packaging layer 131 to be fixed. In this embodiment, the conductive substrates 12 and the second conductive portion 126 are separate from each other, and current flows from the first conductive portion 125 through the plurality of LED chips 11. The current flows from the first conductive portion 125, passes through the LED chips 11 and finally flows through the second conductive portion 126 to form a current loop. Thus, the light bar 14 still can emit light after one end of the light bar 14 is inserted into the fixing block 20 and connected to the circuit board 30.

Figure 10:
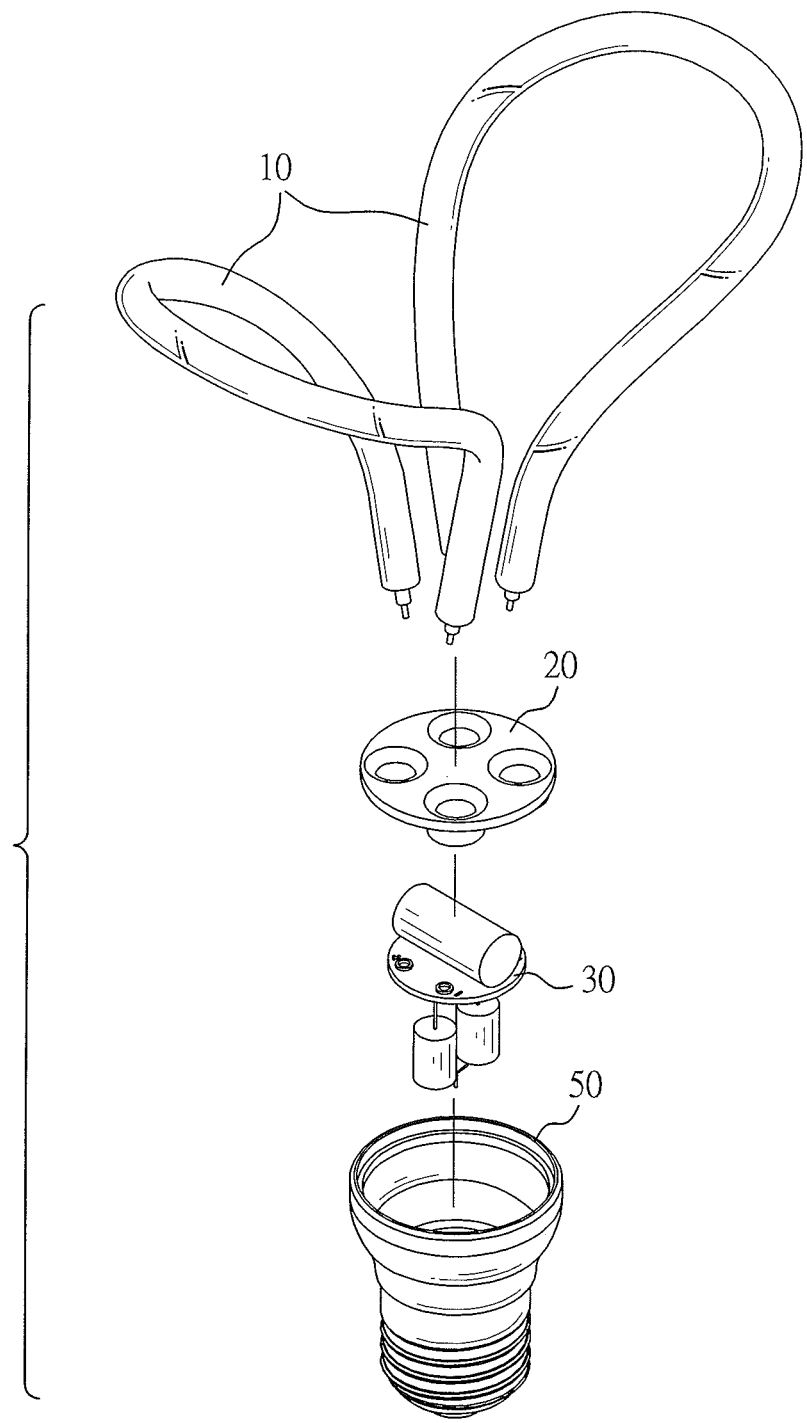
FIG. 10 is an exploded view of the LED lamp of another embodiment in accordance with the present invention.
Figure 11:
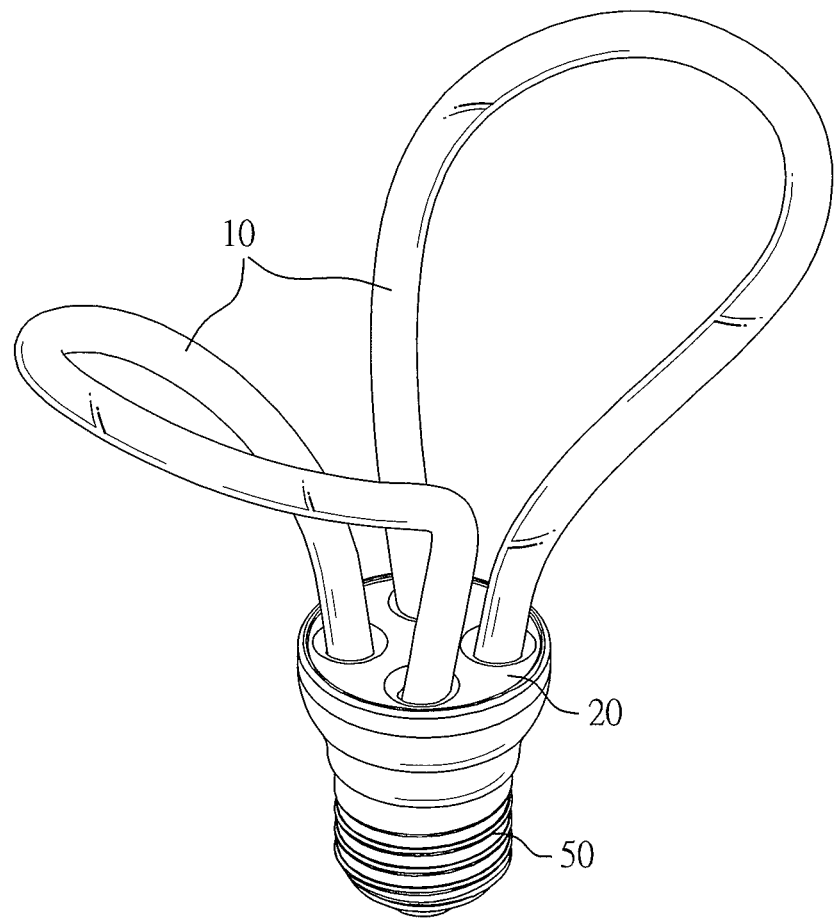
FIG. 11 is a schematic view of the LED lamp of another embodiment in accordance with the present invention.

Referring to FIG. 10 to FIG. 11, another preferred embodiment of the LED lamp differs from the previous embodiment in that the LED lamp has two LED devices 10. To implement this embodiment, the number of holes in the fixing block 20 is increased to four, so that both ends of each LED device 10 are inserted into the fixing block 20.

Figure 12:
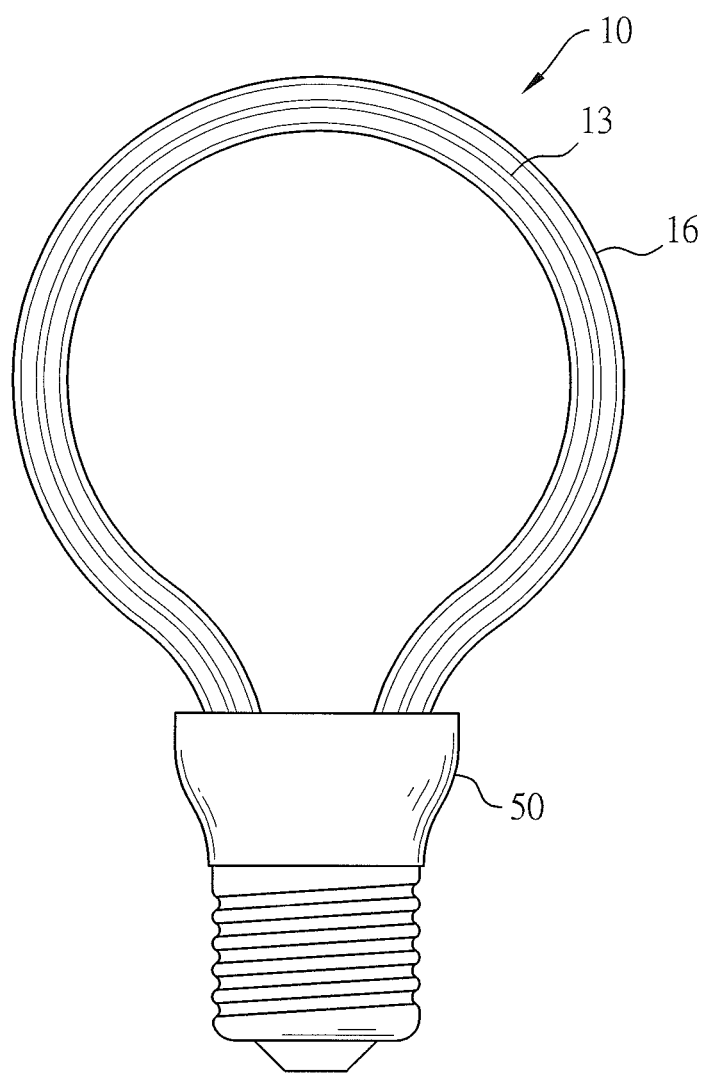
FIG. 12~FIG. 15 are schematic views of the LED lamps in different shapes in accordance with the present invention.
Figure 13:
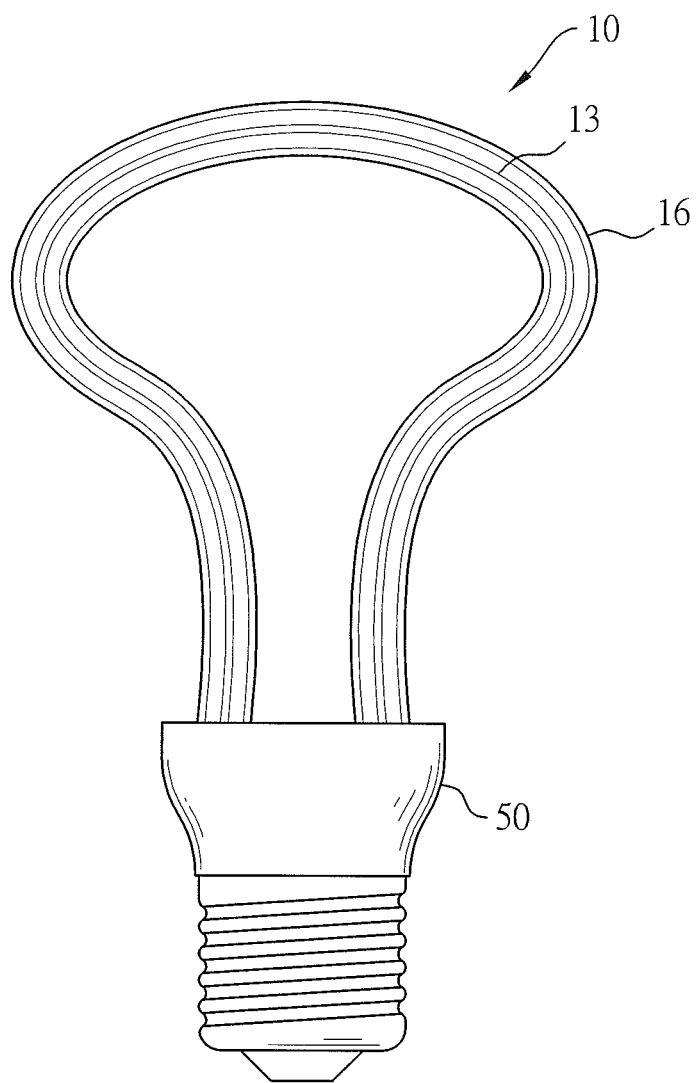
Figure 14:
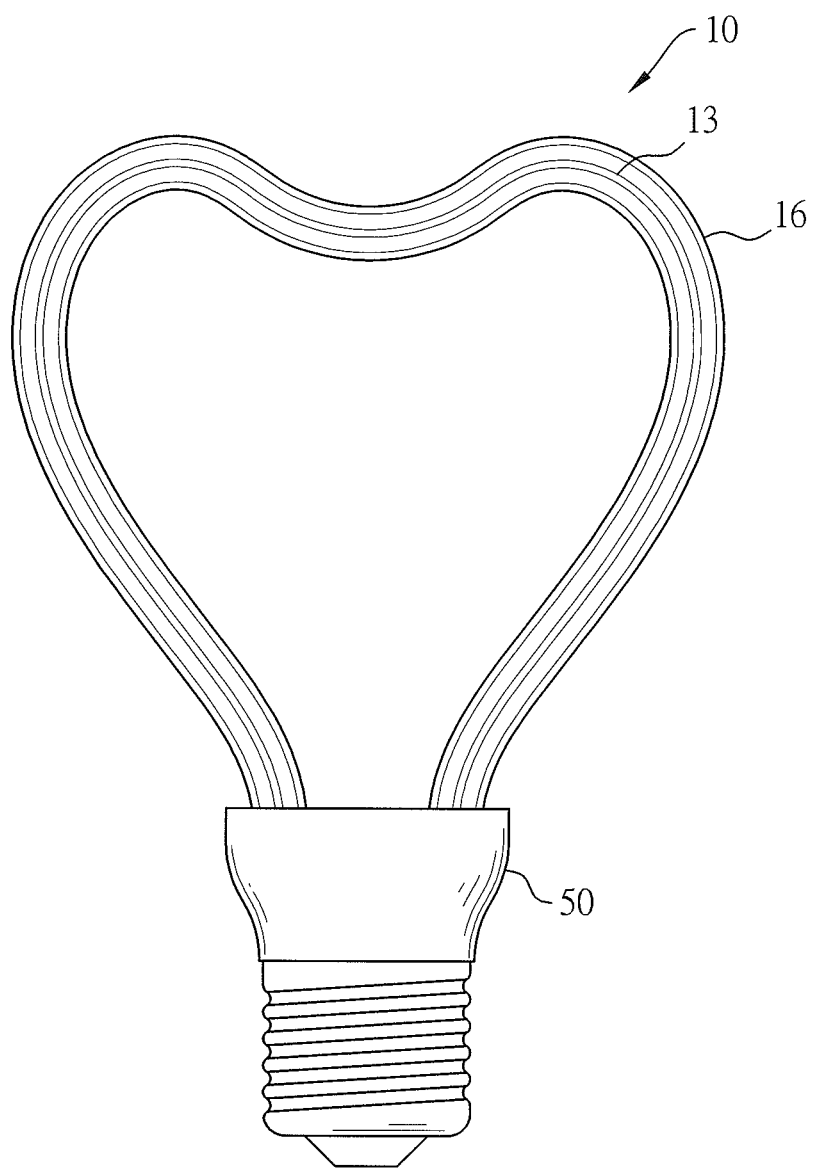
Figure 15:
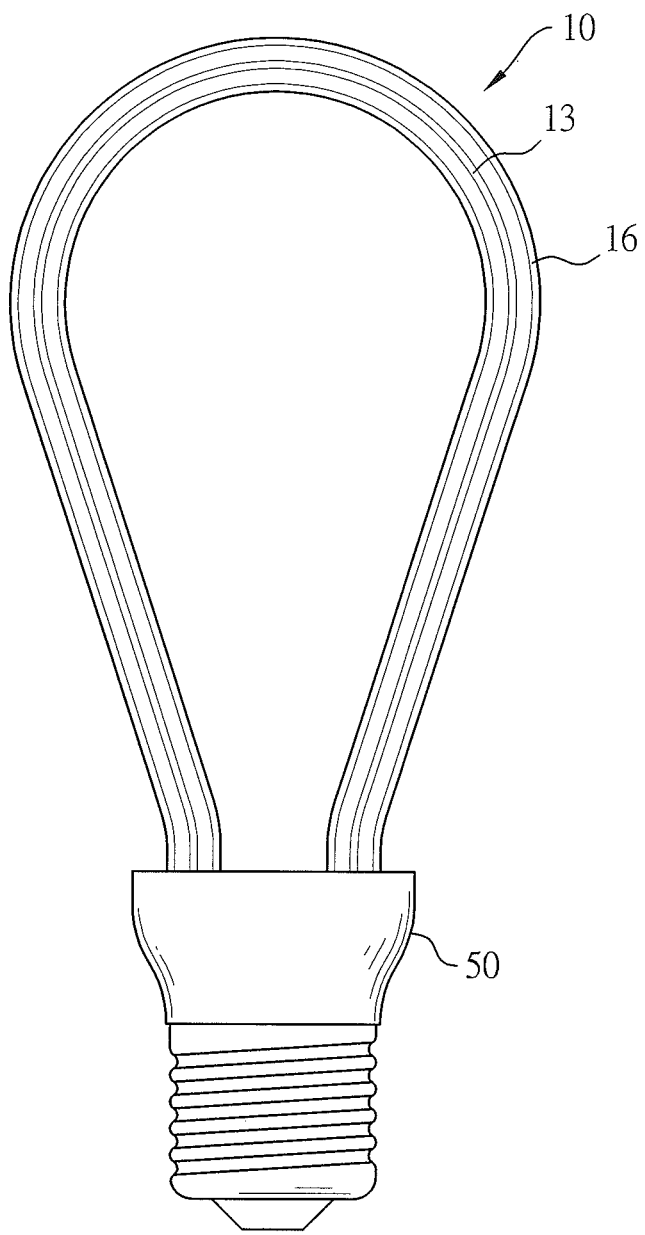
Figure 16:
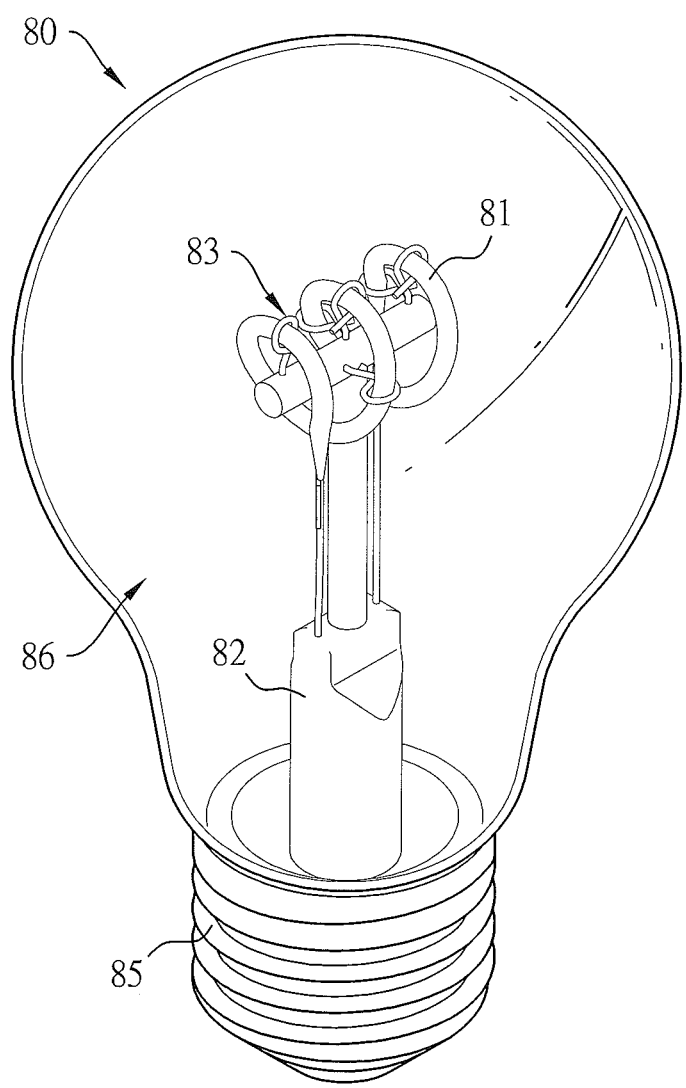
FIG. 16 is a schematic view of a conventional LED lamp in accordance with the prior art.
Figure 17:
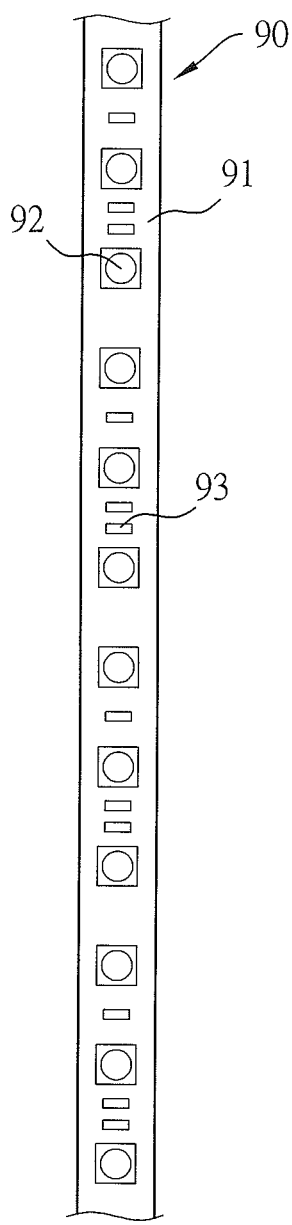
FIG. 17 is a schematic view of a conventional LED light bar in accordance with the prior art.

Referring to FIG. 12 to FIG. 15, the LED device 10 can be manufactured into different shapes. As shown in FIG. 12, the LED device 10 is in a circular shape like a normal bulb light. As shown in FIG. 13, the LED device 10 is in a mushroom shape. As shown in FIG. 14, the LED device 10 is in a heart shape. As shown in FIG. 15, the LED device 10 is in a pear shape. By forming the LED device 10 into different shapes, a variety of modeling options is provided to the user.

Since the LED chips 11 belong to the point light source, the distance between two adjacent LED chips 11 is controlled to be less than twice the length of each LED chip 11 to ensure that the light bar 14 shows continuous light. As the light bar 14, which is formed by connecting a plurality of LED chips 11 to the conductive substrates 12 in sequence, has flexibility, the LED device 10 is allowed to be manufactured in any specific shape, thereby providing a variety of options.

Even though characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. An LED lamp comprising:
    an LED device having
        multiple LED chips, wherein top surfaces and bottom surfaces of the multiple LED chips emit light;
        multiple conductive substrates, each of the multiple conductive substrates having two opposite edges respectively adjacent to a preceding conductive substrate and a subsequent conducive substrate, wherein each of the multiple conductive substrates is a metal foil, the multiple conductive substrates are arranged at intervals, and the multiple LED chips are mounted on only one side of the multiple conductive substrates, and each of the multiple LED chips is supported by and electrically connected between two adjacent conductive substrates of the multiple conductive substrates, wherein a length of each LED chip is W1, a distance between two adjacent LED chips of the multiple LED chips is W2, and W2<2W1;
    a packaging layer including an upper packaging layer and a lower packaging layer, wherein the upper packaging layer is pervious to light and covers the multiple LED chips and top surfaces of the multiple conductive substrates, wherein the lower packaging layer covers the bottom surfaces of the multiple LED chips and the multiple conductive substrates, wherein the packaging layer, the multiple LED chips and the multiple conductive substrates form a light bar; and
    a protective cover being a curved tube mounted around the light bar, wherein the protective cover is pervious to light and is insulative, wherein an inner diameter of the protective cover is between 3 mm and 15 mm and an outer diameter of the protective cover is between 4 mm and 16 mm;
    a fixing block having at least one hole allowing at least one end of the light bar to pass through so as to mount the LED device to the fixing block, with the light bar configured to have flexibility to be mounted in the curved tube and to pass through the at least one hole;
    a circuit board electrically connected to at least one end of the light bar for controlling the LED device; and
    a lamp base for holding and mounting the fixing block and the circuit board therein;
    wherein a width of each of the multiple conductive substrates is D1, and wherein the inner diameter of the protective cover is D3;
    wherein 0.3<(D1/D3)<1; and
    wherein the opposite edges of each conductive substrate extend out of the packaging layer.

2. The LED lamp as claimed in claim 1, wherein the upper packaging layer is made of an insulating material selected from fluorescent glue, resin, plastic, glass, rubber, silicone, macromolecule polymer and organic substance.

3. The LED lamp as claimed in claim 1, wherein the protective cover is a tube heated to soften the tube and shaped in a mold into the curved tube.

4. The LED lamp as claimed in claim 1, wherein the upper packaging layer has a first length L1, which is a thickness of the upper packaging layer measured along a direction from the top surface of each conductive substrate toward a light-emitting surface of each LED chip;
    wherein the upper packaging layer has a second length L2, which is a thickness of the upper packaging layer laterally measured from a center of each conductive substrate to a side surface of the upper packaging layer; and
    wherein 3L1>L2.

5. The LED lamp as claimed in claim 1, wherein the upper packaging layer and the lower packaging layer both have a thickness and are semi-elliptical arcs in shape.

6. The LED lamp as claimed in claim 1, wherein the light bar further comprises a lower light-transmitting plate, which is insulated, transparent and disposed on bottom surfaces of the conductive substrates.

7. An LED lamp comprising:
    an LED device having:
        multiple LED chips, wherein top surfaces and bottom surfaces of the multiple LED chips emit light;
        multiple conductive substrates including a plurality of positive electrode conductive substrates and a negative electrode conductive substrate, each of the multiple conductive substrates having two opposite edges, wherein the plurality positive electrode conductive substrates are arranged at intervals, the multiple LED chips are mounted on only one side of the multiple conductive substrates, and each of the multiple LED chips is supported by and electrically connected between two adjacent positive conductive substrates of the multiple conductive substrates and the negative electrode conductive substrate, wherein a length of each LED chip is W1, a distance between two adjacent LED chips of the multiple LED chips is W2, and W2<2W1; wherein the negative electrode conductive substrate is provided on one side of the plurality of positive electrode conductive substrates;
    a packaging layer including an upper packaging layer and a lower packaging layer, wherein the upper packaging layer is pervious to light and covers the multiple LED chips and top surfaces of each positive electrode conductive substrate and the negative electrode conductive substrate, wherein the lower packaging layer covers the bottom surfaces of the multiple LED chips and bottom surfaces of each positive electrode conductive substrate and the negative electrode conductive substrate, wherein the two opposite edges of each positive electrode conductive substrate and the negative electrode conductive substrate extend beyond the packaging layer, and the packaging layer, the LED chips and the multiple conductive substrates form a light bar; and a protective cover being a curved tube mounted around the light bar, wherein the protective cover is pervious to light and is insulative, wherein an inner diameter of the protective cover is between 3 mm and 15 mm and an outer diameter of the protective cover is between 4 mm and 16 mm;

a fixing block having at least one hole allowing at least one end of the light bar to pass through to mount the LED device to the fixing block, with the light bar configured to have flexibility to be mounted in the curved tube and to pass through the at least one hole;

a circuit board electrically connected to at least one end of the light bar for controlling the LED device; and a lamp base for holding and mounting the fixing block and the circuit board therein;

wherein a width of each of the multiple conductive substrates is D1, and wherein the inner diameter of the protective cover is D3; and wherein 0.3<(D1/D3)<1.

8. The LED lamp as claimed in claim 7, wherein the upper packaging layer is made of an insulating material selected from fluorescent glue, resin, plastic, glass, rubber, silicone, macromolecule polymer and organic substance.

9. The LED lamp as claimed in claim 7, wherein the protective cover is a tube heated to soften the tube and shaped in a mold into the curved tube.

10. The LED lamp as claimed in claim 7, wherein the upper packaging layer has a first length L1, which is a thickness of the upper packaging layer measured along a direction from the top surface of each conductive substrate toward a light-emitting surface of each LED chip;

wherein the upper packaging layer has a second length L2, which is a thickness of the upper packaging layer laterally measured from a center of each conductive substrate to a side surface of the upper packaging layer; and wherein 3L1>L2.

11. The LED lamp as claimed in claim 10, wherein the packaging layer further includes a lower packaging layer covering bottom surfaces of the multiple LED chips and the multiple conductive substrates.

12. The LED lamp as claimed in claim 11, wherein the upper packaging layer and the lower packaging layer each have a thickness and are semi-elliptical arcs in shape, through which light is emitted uniformly outwards.

13. The LED lamp as claimed in claim 7, wherein the light bar further comprises a lower light-transmitting plate, which is insulated, transparent and disposed on bottom surfaces of the conductive substrates.

* * * * *